United States Patent
Tsuchihashi et al.

(10) Patent No.: US 11,061,291 B2
(45) Date of Patent: Jul. 13, 2021

(54) ELECTRONIC APPARATUS

(71) Applicant: LENOVO (SINGAPORE) PTE. LTD., Singapore (SG)

(72) Inventors: Moriyuki Tsuchihashi, Kanagawa (JP); Kazuo Fujii, Kanagawa (JP); Hirohide Komiyama, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 16/726,077

(22) Filed: Dec. 23, 2019

(65) Prior Publication Data

US 2020/0201101 A1 Jun. 25, 2020

(30) Foreign Application Priority Data

Dec. 25, 2018 (JP) .............................. JP2018-241551

(51) Int. Cl.
| | | |
|---|---|---|
| *G06F 1/16* | (2006.01) | |
| *G02F 1/1345* | (2006.01) | |
| *G06F 3/044* | (2006.01) | |
| *G02F 1/1333* | (2006.01) | |
| *H05K 1/02* | (2006.01) | |

(52) U.S. Cl.
CPC ...... *G02F 1/13452* (2013.01); *G02F 1/13338* (2013.01); *G02F 1/133308* (2013.01); *G06F 1/1616* (2013.01); *G06F 1/1637* (2013.01); *G06F 1/1683* (2013.01); *G06F 3/0447* (2019.05); *H05K 1/0277* (2013.01)

(58) Field of Classification Search
CPC .................................................. G06F 1/1683
See application file for complete search history.

(56) References Cited

U.S. PATENT DOCUMENTS

| | | | | |
|---|---|---|---|---|
| 2012/0262887 A1* | 10/2012 | Park | ...................... | G06F 1/1624 361/749 |
| 2014/0376192 A1* | 12/2014 | Park | ...................... | G06F 1/1683 361/728 |
| 2015/0319862 A1* | 11/2015 | Kuriyama | .............. | H05K 1/028 349/56 |

(Continued)

FOREIGN PATENT DOCUMENTS

| | | |
|---|---|---|
| JP | 09114389 A | 5/1997 |
| JP | 201125072 A | 5/2001 |

(Continued)

*Primary Examiner* — Adrian S Wilson
(74) *Attorney, Agent, or Firm* — Antony P. Ng; Russell Ng PLLC

(57) ABSTRACT

An electronic apparatus that can secure a space in a bezel while controlling the thickness of a main body, in which a display is disposed, and the width of a bezel to a minimum is disclosed. The electronic apparatus includes a main body having a display and a bezel disposed around the display, a first board that controls an image displayed on the display, and an FPC that connects at least two terminal groups arranged along one side of the display and the first board. The first board is disposed at a position adjacent to the one side in the bezel, and the FPC has a first wiring section connected to at least two terminal groups and extends, grouping together wires at one place on the rear surface of the display, and a second wiring section that connects the wires grouped together by the first wiring section to the first board.

6 Claims, 4 Drawing Sheets

(56) References Cited

U.S. PATENT DOCUMENTS

| | | | |
|---|---|---|---|
| 2016/0054759 A1* | 2/2016 | Lee | G06F 1/1683 361/679.28 |
| 2016/0212839 A1 | 7/2016 | Choi et al. | |
| 2018/0324964 A1* | 11/2018 | Yoo | G06F 1/1681 |

FOREIGN PATENT DOCUMENTS

| | | | |
|---|---|---|---|
| JP | 2006243322 A | 9/2006 |
| JP | 2008145840 A | 6/2008 |
| JP | 2014186162 A | 10/2014 |
| JP | 2016143357 A | 8/2016 |
| JP | 2017227857 A | 12/2017 |
| JP | 2017537418 A | 12/2017 |
| JP | 2018093101 A | 6/2018 |
| WO | 2014073504 A1 | 9/2016 |

* cited by examiner

ELECTRONIC APPARATUS

PRIORITY CLAIM

The present application claims benefit of priority under 35 U.S.C. §§ 120, 365 to the previously filed Japanese Patent Application No. JP2018-241551 with a priority date of Dec. 25, 2018, which is incorporated by reference herein.

TECHNICAL FIELD

The present invention relates to electronic apparatuses in general, and in particular to an electronic apparatus that can secure a space in a bezel while controlling the thickness of a main body, in which a display is disposed, and a bezel width to a minimum.

BACKGROUND

Electronic apparatuses, such as laptop personal computers (PCs), typically include a display chassis. The display chassis includes a display screen, which displays the results of information processing executed by a main board, and a touch panel installed on the surface of the display screen. A bezel shaped like a rectangular frame is disposed around the display screen of the display chassis.

A conventional electronic apparatus may not be capable of securing a space in a bezel while controlling the thickness of a main body (a display chassis) in which a display is disposed, and a bezel width to a minimum.

Consequently, it would be desirable to provide an electronic apparatus that can secure a space in a bezel while controlling the thickness of a main body in which a display is disposed, and a bezel width to a minimum.

SUMMARY

In accordance with an embodiment of the present disclosure, an electronic apparatus includes a first main body having a display and a bezel enclosing four sides of the display; a first board that controls an image displayed on the display; and a flexible printed circuit (FPC) that connects at least two terminal groups, which are disposed along one side of the display, and the first board, wherein the first board is disposed at a position adjacent to the one side in the bezel, and the FPC has a first wiring section connected to the at least two terminal groups and is extended such that wires are grouped together at one place at a rear surface of the display, and a second wiring section that connects the wires grouped together by the first wiring section to the first board.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
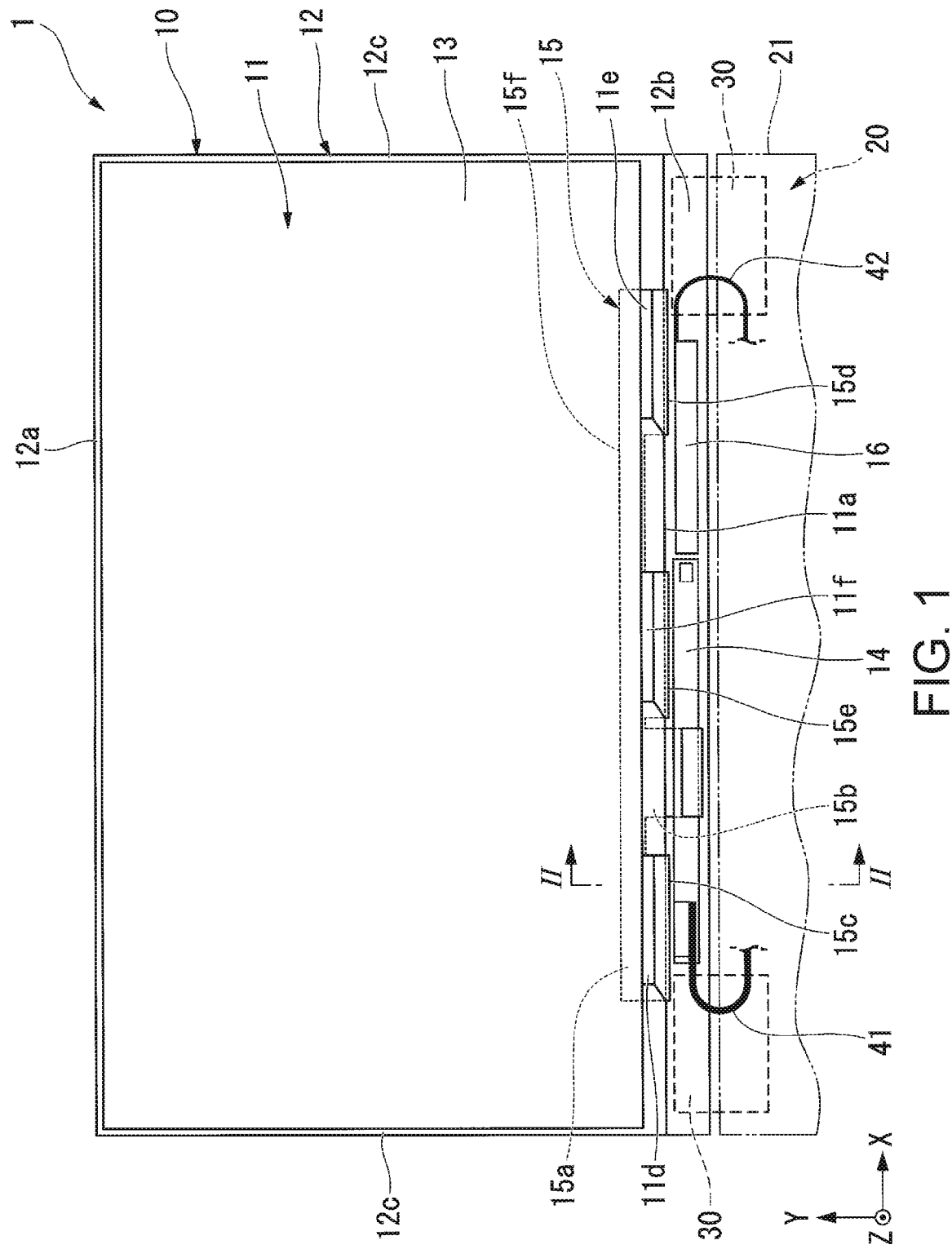
FIG. 1 is a front view illustrating an electronic apparatus, according to one embodiment.
Figure 2:
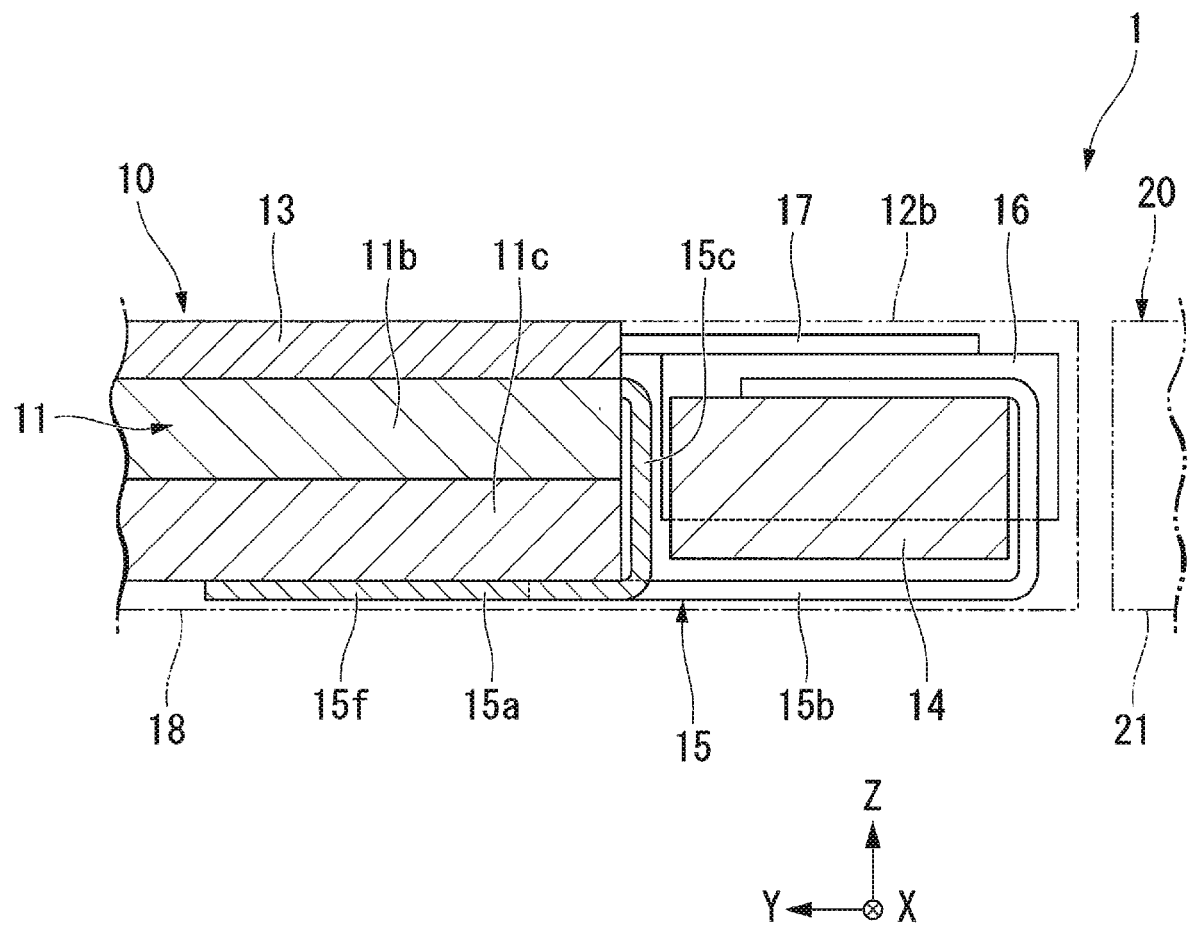
FIG. 2 is a sectional view illustrating a section taken along line II-II of FIG. 1.

As illustrated in FIG. 1 and FIG. 2, the electronic apparatus 1 of the present embodiment is a so-called clamshell type (laptop type) personal computer. The electronic apparatus 1 includes a rectangular display 11, a first main body 10 having a bezel 12 and a touch sensor panel 13, a first board 14, a first flexible printed circuit (FPC) 15, a second board 16, a second FPC 17, a second main body 20, a pair of hinges 30, a first wiring member 41, and a second wiring member 42.

The first main body 10 and the second main body 20 are connected through the pair of hinges 30 such that the first main body 10 and the second main body 20 can be rotated with respect to each other. The first main body 10 and the second main body 20 can be relatively moved about the hinge axis of the hinges 30 between a closed state and an opened state.

I. Definitions of Directions

In the present embodiment, the positional relationships of components are described by setting an XYZ orthogonal coordinate system. In the following description, the direction along an X-axis will be referred to as the lateral direction, the direction along a Y-axis will be referred to as the vertical direction, and the direction along a Z-axis will be referred to as the thickness direction.

The lateral direction is a first direction in which one side 11a of the display 11 extends. In the lateral direction, the direction from both end portions of the display 11 toward a central portion will be referred to as the inner side of the lateral direction, and the direction from the central portion toward the both end portions will be referred to as the outer side of the lateral direction.

The vertical direction is a second direction in which a side that is orthogonal to the one side 11a of the display 11 extends. In the present embodiment, the vertical direction is a direction that connects a portion of the bezel 12, which portion is the farthest from the second main body 20 (the porting being an upper bezel section 12a to be discussed later), and a portion thereof which is the nearest the second main body 20 (the portion being a lower bezel section 12b) when viewed with the display 11 of the first main body 10 in the opened state at the front, as illustrated in FIG. 1. In the vertical direction, a direction from a portion in the bezel 12, which portion is nearest the second main body 20, to a portion which is farthest therefrom will be referred to as the upper side (+Y side), and the direction that is opposite therefrom will be referred to as the lower side (?Y side).

The thickness direction is a third direction that is orthogonal to the first direction and the second direction. The display 11 and the touch sensor panel 13 are disposed, being overlapped in the thickness direction. In the thickness direction, a direction from the display 11 toward the touch sensor panel 13 will be referred to as the front surface side (+Z side), and a direction from the touch sensor panel 13 toward the display 11 will be referred to as the rear surface side (?Z side).

II. First Main Body

The first main body 10 has the display 11, the bezel 12, the touch sensor panel 13, and a cover 18. The display 11 is, for example, a liquid crystal display, an organic EL display or the like. In the present embodiment, the display 11 is a liquid crystal display. The display 11 is shaped like a rectangular plate, a pair of the plate surfaces being oriented in the thickness direction. In the present embodiment, the lateral length of the display 11 is greater than the vertical length of the display 11.

As illustrated in FIG. 1 and FIG. 2, the display 11 has a display section 11*b*, a backlight section 11*c*, and terminal groups 11*d*, 11*e* and 11*f*. Here, the display 11 of the present embodiment has three terminal groups, however, the display may have at least two terminal groups.

The display section 11*b* is formed by, for example, laminated liquid crystal layers or alignment layers. The backlight section 11*c* is disposed on the rear surface of the display section 11*b*.

The terminal groups 11*d*, 11*e* and 11*f* are arranged along the one side 11*a* of the display 11. The one side 11*a* is the lower side of the display 11. The terminal groups 11*d*, 11*e* and 11*f* are individually included in, for example, a plurality of liquid crystal display (LCD) driver chips arranged along the one side 11*a* of the display 11. The terminal groups 11*d*, 11*e* and 11*f* are electrically connected with the display section 11*b* and the backlight section 11*c*.

In the present embodiment, the three terminal groups 11*d*, 11 *e* and 11*f* are provided in the lateral direction with intervals provided there among. Of the three terminal groups 11*d*, 11 *e* and 11*f*, the first terminal group 11*d* is disposed at a lower left portion of the display 11. The second terminal group 11*e* is disposed at a lower right portion of the display 11. The third terminal group 11*f* is disposed at a lower central portion of the display 11. The third terminal group 11*f* is positioned between the first terminal group 11*d* and the second terminal group 11*e* in the lateral direction.

The bezel 12 is shaped like a rectangular frame. The bezel 12 encloses four sides of the display 11. The bezel 12 has an upper bezel section 12*a*, the lower bezel section 12*b*, and a pair of side bezel sections 12*c*.

The upper bezel section 12*a* is disposed on the upper side of the display 11, and extends in the lateral direction. The lower bezel section 12*b* is disposed on the lower side of the display 11, and extends in the lateral direction. The vertical length (the width) of the lower bezel section 12*b* is greater than the vertical length of the upper bezel section 12*a*. The pair of side bezel sections 12*c* is disposed on both outer sides in the lateral direction of the display 11, and extends in the vertical direction.

The touch sensor panel 13 is rectangular. The touch sensor panel 13 is like a sheet having a pair of front and rear surfaces thereof oriented in the thickness direction. The touch sensor panel 13 is disposed on the front surface of the display 11. The touch sensor panel 13 covers the display 11 from the front surface side. The touch sensor panel 13 is transparent. A user can view the display 11 through the touch sensor panel 13. The touch sensor panel 13 is configured by including, for example, capacitance type sensors, and detects operation inputs by the user.

The cover 18 constitutes at least a part of the chassis of the first main body 10. The cover 18 has a plate-like part that covers the display 11 from the rear surface side.

Further, the first board 14, the first FPC 15, the second board 16, and the second FPC 17 are housed in the first main body 10.

III. First Board

The first board 14 is electrically connected to the display 11 through the first FPC 15. The first board 14 controls images displayed on the display 11. The first board 14 may be referred to as a display board. In the present embodiment, the first board 14 is an LCD board.

As illustrated in FIG. 1, the first board 14 is shaped like a plate that extends in the lateral direction. The first board 14 has a pair of plate surfaces oriented in the thickness direction. The first board 14 is disposed at a position adjacent to the one side (lower side) 11*a* of the display 11 in the bezel 12. The first board 14 is disposed in the lower bezel section 12*b*. The lateral length of the first board 14 is, for example, less than half the lateral length of the display 11. The length of the first board 14 in the thickness direction (the thickness dimension) is, for example, 2 mm or less.

IV. First FPC

The first flexible printed circuit (FPC) 15 may be referred to simply as the FPC. The first FPC 15 connects the terminal groups 11*d*, 11*e* and 11*f* and the first board 14. In the present embodiment, the first FPC 15 electrically connects the three terminal groups 11*d*, 11 *e* and 11*f* and the first board 14. The first FPC 15 is like a film and can be deformed while maintaining the electrical characteristics (functions). The first FPC 15 has, for example, one or two conductive layers. The film thickness of the first FPC 15 is smaller than the thickness dimension of the first board 14 and the thickness dimension of the second board 16. The film thickness of the first FPC 15 is, for example, 0.2 mm or less. An IC chip may be mounted on the first FPC 15.

The lateral length of the first board 14 is smaller than the lateral length of the first FPC 15. The first FPC 15 has a first wiring section 15*a* and a second wiring section 15*b*. The first wiring section 15*a* is connected to the terminal groups 11*d*, 11*e* and 11*f*, and extends, grouping together wires at one place on the rear surface of the display 11. The first wiring section 15*a* is folded back toward the rear surface of the display 11 from the one side 11*a* of the display 11. The first wiring section 15*a* is folded back toward the rear surface of the display 11 from the lower end of the display 11.

Figure 3:
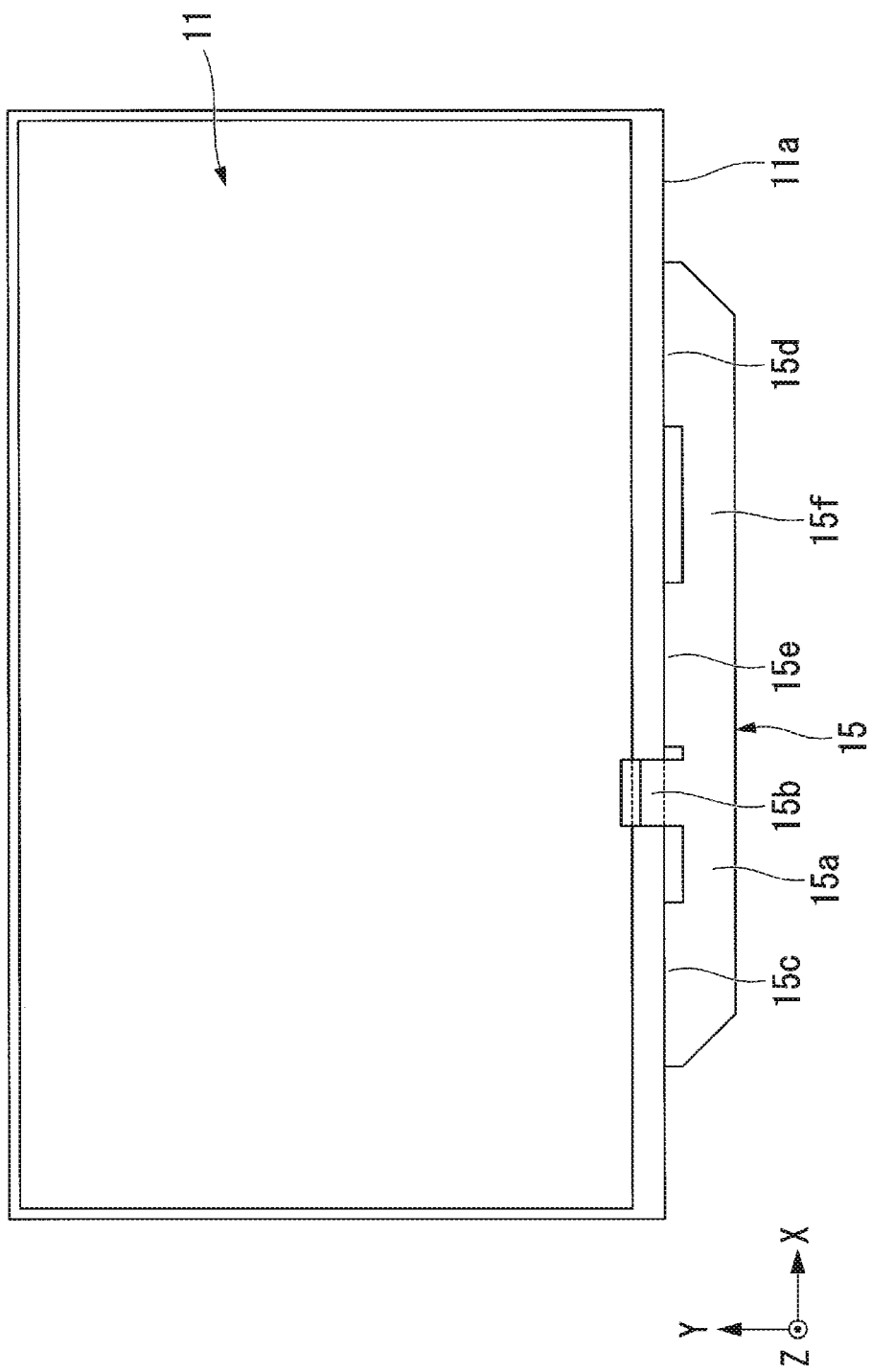
FIG. 3 is a plan view illustrating a display and a first FPC in a state before a first wiring section is folded back to the rear surface of the display.
Figure 4:
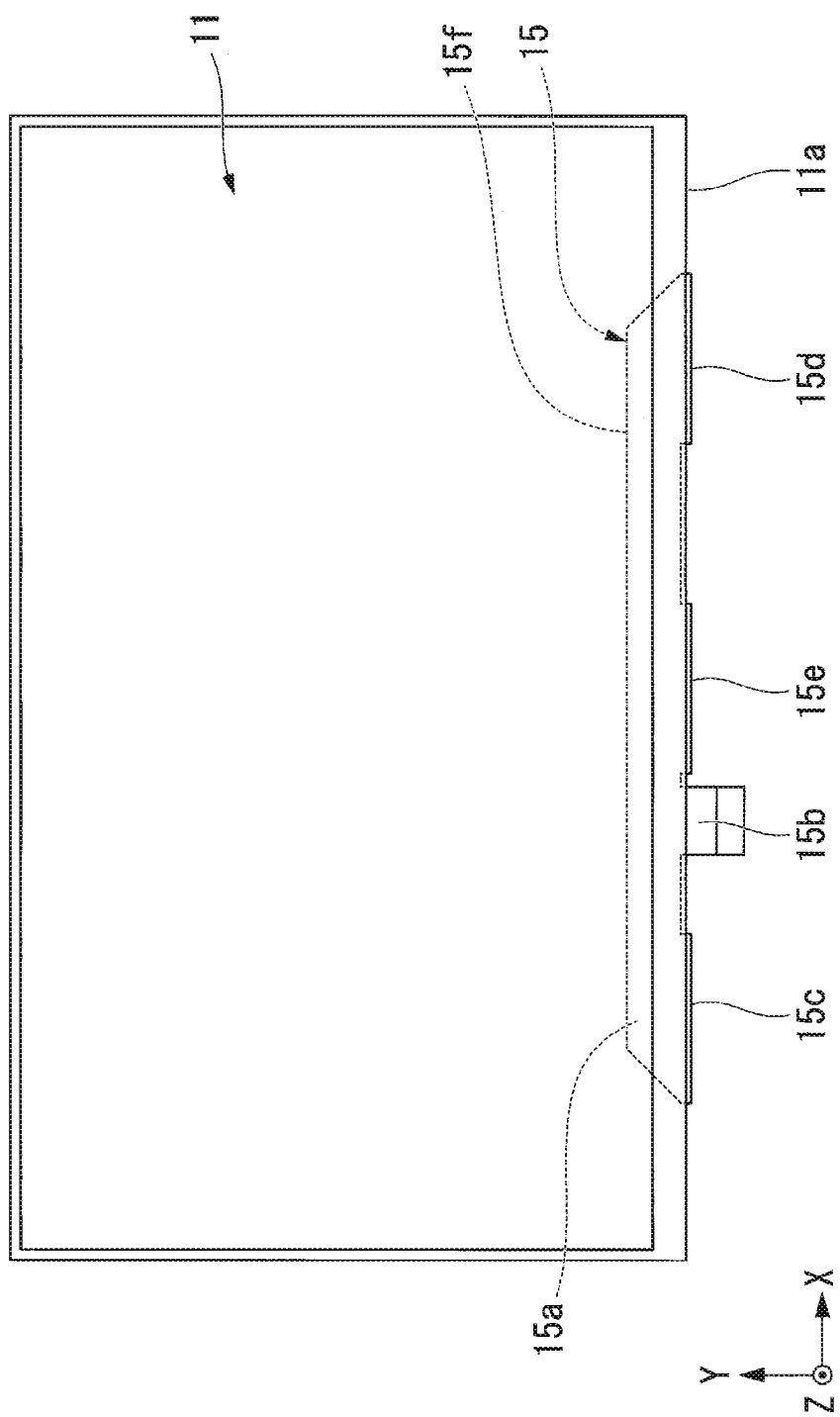
FIG. 4 is a plan view illustrating the display and the first FPC in a state after the first wiring section is folded back to the rear surface of the display.

FIG. 3 is a plan view (front view) illustrating the display 11 and the first FPC 15 in a state before the first wiring section 15*a* is folded back to the rear surface of the display 11. FIG. 4 is a plan view illustrating the display 11 and the first FPC 15 in a state after the first wiring section 15*a* is folded back to the rear surface of the display 11. As illustrated in FIGS. 1 and 2, the first wiring section 15*a* is housed in the first main body 10 with the first wiring section 15*a* folded back to the rear surface of the display 11 (the state of FIG. 4). In FIG. 2 to FIG. 4, the terminal groups 11*d*, 11 *e* and 11*f* (LCD driver chips) are not illustrated.

As illustrated in FIG. 1 to FIG. 4, the first wiring section 15*a* has a plurality of connecting portions 15*c*, 15*d* and 15*e*, and an extension section 15*f*.

The plurality of connecting portions 15*c*, 15*d* and 15*e* connect to at least two or more terminal groups 11*d*, 11*e* and 11*f*. The number of the connecting portions 15*c*, 15*d* and 15*e* is the same as the number of the terminal groups 11*d*, 11*e* and 11*f*. In the present embodiment, the three connecting portions 15*c*, 15*d* and 15*e* are provided in the lateral direction with intervals provided there among.

Of the three connecting portions 15*c*, 15*d* and 15*e*, the first connecting portion 15*c* is disposed at the lower left portion of the display 11, and connects to the first terminal group 11d. The second connecting portion 15d is disposed at the lower right portion of the display 11, and connects to the second terminal group 11e. The third connecting portion 15e is disposed at a lower central portion of the display 11, and connects to the third terminal group 11f. The third connecting portion 15e is positioned between the first connecting portion 15c and the second connecting portion 15d in the lateral direction.

In FIG. 3, the connecting portions 15c, 15d and 15e connect the terminal groups 11d, 11e, 11f and the extension section 15f in the vertical direction. In the connecting portions 15c, 15d and 15e, the portions that connect to the terminal groups 11d, 11e and 11f are composed of a material that is more easily deformed than the portions that connect to the extension section 15f.

As illustrated in FIG. 4, the extension section 15f connects to the plurality of the connecting portions 15c, 15d and 15e, and the second wiring section 15b, and extends in the lateral direction at the rear surface of the display 11. The extension section 15f overlaps the display 11 when the display 11 is viewed from the front, i.e., when viewed from the thickness direction (the Z-axis direction). In the illustrated example, the length of the extension section 15f in the lateral direction decreases as the vertical distance thereof from the connecting portions 15c, 15d and 15e increases.

The direction in which the plurality of connecting portions 15c, 15d and 15e project the extension section 15f and the direction in which the second wiring section 15b projects therefrom are the same with each other. As illustrated in FIG. 1, FIG. 2 and FIG. 4, the plurality of connecting portions 15c, 15d and 15e project downward from the extension section 15f. The second wiring section 15b projects downward from the extension section 15f.

The second wiring section 15b connects the wires grouped together by the first wiring section 15a to the first board 14. The second wiring section 15b has a portion that vertically extends between the extension section 15f and the first board 14. In the present embodiment, the second wiring section 15b and the first board 14 are connected by, for example, BtoB® connector. In the second wiring section 15b, a portion to be connected to the first board 14 is composed of a material that is more easily deformed than that of a portion to be connected to the extension section 15f.

The second wiring section 15b is disposed among the terminal groups 11d, 11e and 11f in the lateral direction. In the present embodiment, the second wiring section 15b is disposed between the first terminal group 11d and the third terminal group 11f in the lateral direction.

V. Second Board

The second board 16 is electrically connected to the touch sensor panel 13 through the second FPC 17. The second board 16 processes the operation inputs of the user detected by the touch sensor panel 13. The second board 16 may be referred to as a touch sensor board.

As illustrated in FIG. 1, the second board 16 is shaped like a plate extending in the lateral direction. The second board 16 has a pair of plate surfaces oriented in the thickness direction. The second board 16 is disposed at a position adjacent to the one side 11a of the display 11 in the bezel 12. The second board 16 is disposed in the lower bezel section 12b. The second board 16 is disposed beside the first board 14 in the lateral direction in the bezel 12. The length of the second board 16 in the lateral direction is smaller than the length of the first board 14 in the lateral direction. The length of the second board 16 in the thickness direction (the thickness dimension) is, for example, 2 mm or less.

VI. Second FPC

The second FPC 17 connects the touch sensor panel 13 and the second board 16. The second FPC 17 is like a film and can be deformed while maintaining the electrical characteristics (functions). The second FPC 17 has, for example, one or two conductive layers. The film thickness of the second FPC 17 is smaller than the thickness dimension of the second board 16 and the thickness dimension of the first board 14. The film thickness of the second FPC 17 is, for example, 0.2 mm or less. The second FPC 17 and the second board 16 are connected by, for example, BtoB (registered trademark) connector.

The length of the second FPC 17 in the lateral direction is smaller than the length of the second board 16 in the lateral direction.

VII. Second Main Body

The second main body 20 is connected to the first main body 10 through the hinges 30. The second main body 20 has a chassis 21, an input unit, such as a keyboard (not illustrated), and a control unit (not illustrated) including mainly a CPU, a memory and an HDD.

VIII. Hinge

The pair of hinges 30 are disposed away from each other in the lateral direction. The pair of hinges 30 are disposed at both end portions in the lateral direction at the lower part of the first main body 10. The pair of hinges 30 are disposed, sandwiching the first board 14 and the second board 16 in the lateral direction, and are rotatably fixed to the bezel 12. The pair of hinges 30 are secured to the lower bezel section 12b. The pair of hinges 30 rotatably connect the first main body 10 and the second main body 20 within the range of at least 180 degrees about a hinge axis extending in the lateral direction. The hinge axis (not illustrated) is the rotational central axis of the hinges 30.

As illustrated in FIG. 1, at least one of the hinges 30 and a part of the first wiring section 15a interfere with each other in the lateral direction. In the present embodiment, the two hinges 30 and the first connecting portion 15c and the second connecting portion 15d of the first wiring section 15a interfere with each other.

More specifically, the left end of the first connecting portion 15c is positioned farther to the left than the right end of the left hinge 30 of the pair of hinges 30, the left hinge 30 being disposed on the left. The right end of the second connecting portion 15d is positioned farther to the right than the left end of the right hinge 30 of the pair of hinges 30, the right hinge 30 being disposed on the right. In other words, a part (the right end portion) of the left hinge 30 is adjacently disposed directly below the first connecting portion 15c, and a part (the left end portion) of the right hinge 30 is adjacently disposed directly below the second connecting portion 15d.

IX. First Wiring Member

The first wiring member 41 extends to the first main body 10 and the second main body 20 through the inside of the hinges 30. The first wiring member 41 electrically connects at least the first board 14 and the control unit (not illustrated). In the illustrated example, the first wiring member 41 passes through the inside of the left hinge 30 of the pair of hinges 30.

X. Second Wiring Member

The second wiring member 42 extends to the first main body 10 and the second main body 20 through the inside of the hinges 30. The second wiring member 42 electrically connects at least the second board 16 and the control unit (not illustrated). In the illustrated example, the second wiring member 42 passes through the inside of the right hinge 30 of the pair of hinges 30.

In the electronic apparatus 1 of the present embodiment described above, the wires of the terminal groups 11d, 11 e and 11f are grouped together by the first wiring section 15a and connected to the first board 14 through the second wiring section 15b. The first wiring section 15a is a part of the first FPC 15, and is thin. Therefore, even when the first wiring section 15a is disposed at the rear surface of the display 11, the thickness of the first main body 10 can still be controlled to a minimum. The first wiring section 15a is disposed at a position that is different from the position of the bezel 12, so that the space occupied by the first FPC 15 in the bezel 12 is controlled to a minimum. This makes it possible to house the first board 14 in the lower bezel section 12b while controlling the vertical width of the lower bezel section 12b to a minimum.

The lateral width of the second wiring section 15b can be made smaller than that of the first wiring section 15a. Hence, the total length in the lateral direction of the first board 14 connected to the second wiring section 15b is controlled to a minimum. The small total length of the first board 14 makes it possible to secure a space for housing other constituent members and the like in the lower bezel section 12b.

Further, in the present embodiment, the first wiring section 15a is folded back from the bottom end (the one side 11a) of the display 11 toward the rear surface of the display 11, thus making it possible to prevent the first FPC 15 from projecting from the display 11 in the thickness direction. This enables the thickness of the first main body 10 to be further stable and small.

Further, in the present embodiment, the second wiring section 15b is disposed among the plurality of terminal groups 11d, 11e and 11f in the lateral direction. This makes it possible to prevent the first board 14 connected to the second wiring section 15b from projecting beyond the first wiring section 15a in the lateral direction, thus making it easy to house the first board 14 in the lower bezel section 12b.

Further, in the present embodiment, the direction in which the plurality of connecting portions 15c, 15d and 15e project and the direction in which the second wiring section 15b projects with respect to the extension section 15f of the first wiring section 15a are the same with each other. Hence, the present embodiment can be achieved by folding once the first FPC 15 back to the rear surface side of the display 11 at the plurality of connecting portions 15c, 15d and 15e, thus changing the state illustrated in FIG. 3 to the state illustrated in FIG. 4. The total vertical length of the first FPC 15 can be controlled to a minimum, the structure can be simplified by minimizing the number of times the first FPC 15 is folded back, and the placement space of the first FPC 15 can be further reduced.

Further, in the present embodiment, at least one of the hinges 30 and a part of the first wiring section 15a interfere with each other in the vertical direction. More specifically, the two hinges 30 interfere with the first connecting portion 15c and the second connecting portion 15d in the vertical direction. Even in this case, the placement space of the first FPC 15 in the lower bezel section 12b is controlled to a minimum, so that the placement space for the hinges 30 can be easily secured in the lower bezel section 12b.

Further, in the present embodiment, since the space is secured in the lower bezel section 12b as described above, the hinges 30 having the structure that enables opening and closing by 180 degrees or more can be adopted.

Further, in the present embodiment, the space in the lateral direction can be secured in the lower bezel section 12b while controlling the vertical width of the lower bezel section 12b to a minimum. This enables the first board 14 and the second board 16 to be disposed side by side in the lateral direction in the lower bezel section 12b. The first board 14 and the second board 16 can be disposed in the bezel 12 without overlapping these boards in the thickness direction, thus controlling the thickness dimension of the first main body 10 to a minimum.

The present invention is not limited to the above-described embodiment, and alterations and the like can be added to the configuration within a range that does not deviate from the gist of the present invention, examples of which will be described below.

In the above-described embodiment, the example in which the electronic apparatus 1 is a laptop PC has been described; however, the present invention is not limited thereto. The electronic apparatus 1 may be an electronic apparatus, such as a tablet PC, other than the laptop PC.

The electronic apparatus 1 may not be provided with the second main body 20 and the pair of hinges 30.

As has been described, the present invention provides an electronic apparatus that can secure a space in a bezel while controlling the thickness of a main body, in which a display is disposed, and a bezel width to a minimum.

While the invention has been particularly shown and described with reference to a preferred embodiment, it will be understood by those skilled in the art that various changes in form and detail may be made therein without departing from the spirit and scope of the invention.

What is claimed is:

1. An electronic apparatus comprising:
    a first main body having a display and a bezel enclosing four sides of said display;
    a touch sensor panel disposed on a front surface of said display;
    a first board, disposed on one side of said display within said bezel of said first main body, controls an image displayed on said display;
    a second board, disposed next to said first board within said bezel of said first main body, connects to said touch sensor panel; and
    a flexible printed circuit (FPC) disposed on a rear surface of said display, wherein said FPC includes
        a first wiring section folds back from said one side of said display and extends to group wires together at one place towards said rear surface of said display, and
        a second wiring section connects said wires that are grouped together by said first wiring section and extends to said first board.

2. The electronic apparatus of claim 1, wherein said first wiring section wraps from said one side of said display towards said rear surface of said display.

3. The electronic apparatus of claim 1, wherein said second wiring section wraps from one side of said first board to an opposite side of said first board.

4. The electronic apparatus of claim 1, wherein said first wiring section includes
- a plurality of connecting portions connected to at least two terminal groups located along said one side of said display; and
- an extension section connects to said plurality of connecting portions and said second wiring section and extends in said one side extends of said display.

5. The electronic apparatus of claim 1, further comprising:
- a pair of hinges which are disposed, sandwiching said first board in a first direction in which said one side of said display extends and which are rotatably fixed to said bezel; and
- a second main body connected to said first main body through said hinges, wherein at least one of said hinges and a part of said first wiring section interfere with each other in a second direction in which a side that is orthogonal to said one side of said display extends.

6. The electronic apparatus of claim 5, wherein said pair of hinges rotatably connect said first main body and said second main body within a range of at least 180 degrees about a hinge axis that extends in said first direction.

* * * * *